United States Patent
Sammartino et al.

(10) Patent No.: US 6,511,280 B1
(45) Date of Patent: Jan. 28, 2003

(54) ADAPTIVE REED-SOLOMON DECODER AND METHODS THEREOF

(75) Inventors: Pablo Eduardo Sammartino, North Richland Hills, TX (US); Weizhong Chen, Keller, TX (US)

(73) Assignee: Motorola, Inc., Schaumburg, IL (US)

( * ) Notice: Subject to any disclaimer, the term of this patent is extended or adjusted under 35 U.S.C. 154(b) by 1212 days.

(21) Appl. No.: 08/646,805

(22) Filed: May 21, 1996

(51) Int. Cl.⁷ ............................................. H03M 13/00
(52) U.S. Cl. ...................... 414/784; 414/752; 414/755; 414/756; 414/767; 414/787; 700/7; 700/44; 370/242
(58) Field of Search ................................ 414/752, 755, 414/784, 787, 756, 767; 370/242; 700/7, 44

(56) References Cited

U.S. PATENT DOCUMENTS 3,987,418 A * 10/1976 Buchanan ................. 340/172.5
5,432,822 A *  7/1995 Kaewell, Jr. ............... 375/340

OTHER PUBLICATIONS

Wicker, Stephen B., "Error Control Systems for Digital Communication and Storage", Prentice Hall, pp. 49–53, 188–191, 203, 211, 224–226, 230–231, 238–239.*
Massey, Capacity, cutoff rate, and coding for a direct–detection optical channel, 1980, Internet, pp. 68–76.*
Costello et al., Applications of Error–Control Coding, 1998, Internet/IEEE, pp. 2531–2560.*
Toumpakaris et al, A byte–erasure method for improved impulse immunity in DSL systems using soft information from an inner code, no date, Internet, pp. 1–6.*
Caldermank, The art of signaling: Fifty years of coding theory, 1998, Internet/IEEE, pp. 256–2595.*
Wicker, Stephen B., Prentice Hall, 1995, "Error Control Systems for Digital Communication and Storage", pp. 49–53, 203, 211, 224–226, 230–231.

* cited by examiner

*Primary Examiner*—William A. Cuchlinski, Jr.
*Assistant Examiner*—McDieunel Marc
(74) *Attorney, Agent, or Firm*—Charles W. Bethards; Matthew C. Loppnow

(57) ABSTRACT

An adaptive Reed-Solomon(RS) decoder (207) and analogous methods arranged and constructed to decode a RS(n,k) encoded symbol stream, including; a code register (211), coupled to the symbol stream, for storing a received code word including code symbols, an index register (213) for storing a location information corresponding to each of a portion of the code symbols, a processor (215), coupled to the code register (211) and the index register (213), for performing soft decision decoding using an error parameter (217) and an erasure parameter (219) to provide corrected data (215) when the decoding is successful and to provide a failure indication (221) when decoding is unsuccessful, and a controller (223), coupled to the processor (215), for providing the error parameter and the erasure parameter and for adjusting the error parameter and the erasure parameter when the processor provides the failure indication.

36 Claims, 3 Drawing Sheets

ADAPTIVE REED-SOLOMON DECODER AND METHODS THEREOF

FIELD OF THE INVENTION

The present disclosure concerns Reed-Solomon decoders that are arranged and constructed to adapt decoding operation to, for example, better accommodate varying channel conditions.

BACKGROUND OF THE INVENTION

Reed-Solomon decoders are known. The literature shows the concept of soft-decision receivers, in particular erasure Reed-Solomon decoders. Various algorithms for erasure decoding are also known. Generally erasure decoding is a process of decoding that uses in addition to a received code word certain channel quality information corresponding to the symbols of the code word. The expectation is that when the channel quality is low the likelihood of an error is high. A symbol in the code word with a corresponding low or poor channel quality is often referred to as an erasure. It has been shown that a soft decision receiver is capable of correcting up to twice as many channel induced errors as a hard decision receiver, provided the channel quality information is reliable.

In any event one erasure algorithm, described along with others in *Error Control Systems for Digital Communication and Storage*, by Stephen B. Wicker. Prentice Hall, 1995, is Euclid's algorithm for erasure Reed-Solomon decoding. This algorithm is expected to reduce the computational intensity of a soft-decision receiver to a level comparable with a hard-decision receiver (for codes up to the order of about 40 symbols per code word). This algorithm requires as inputs a received code word, a list of erasures and two parameters, one indicating how many erasures are provided and one indicating up to how many errors to correct. Increasing one of the parameters requires that the other be decreased.

The above notwithstanding soft decision receivers have not gained wide acceptance in communications systems and equipment that must operate with widely varying channel characteristics, such as encountered in wireless communications. Generally a wireless channel will experience additive white guassian noise and extreme variations in channel loss. These variations in channel loss are caused, in some cases by differences in effective channel length and more often by fading caused by multiple signal paths and the Doppler effect.

Additionally the errors resulting from additive white guassian noise are randomly located within the code word and may not be highly correlated with observed channel quality. This type of error is more readily corrected using the inherent error correcting capability of a Reed-Solomon code rather than a soft decision or erasure Reed-Solomon approach. Said another way we should increase the parameter indicating number of errors to correct in for example the Euclid algorithm. On the other hand errors resulting from channel fades tend to be grouped together and highly correlated with observed channel quality. These errors are readily corrected as erasures, so we should increase the parameter indicating number of erasures. However as noted above increasing one parameter means decreasing another. This problem has resulted in reluctance on the part of practitioners to use this form of decoder, notwithstanding the theoretical 2x potential improvement in error correcting ability.

Clearly a need exists for an adaptable Reed-Solomon decoder and methods thereof suitable for use in a soft decision receiver with varying channel characteristics.

SUMMARY OF THE INVENTION

This invention is directed to an adaptive soft decision receiver including an adaptive Reed-Solomon decoder and corresponding method of adaptively decoding a Reed-Solomon(RS) encoded channel that is arranged and constructed to demodulate and decode a RS(n,k) encoded symbol stream. The receiver includes a symbol detector coupled to the channel for detecting channel symbols and providing a corresponding code symbol stream and the adaptive Reed-Solomon decoder. The adaptive Reed-Solomon decoder executes the aforementioned method and includes a code register, coupled to the symbol detector, for storing a received code word including n code symbols, an index register, coupled to the symbol detector for storing a location information corresponding to a portion of the code symbols, a processor, coupled to the code register and the index register, for performing soft decision decoding using an error parameter and an erasure parameter to provide corrected data when the soft decision decoding is successful and to provide a failure indication when the soft decision decoding is unsuccessful, and a controller, coupled to the processor, for providing the error parameter and the erasure parameter and for adjusting the error parameter and the erasure parameter when the processor provides the failure indication.

BRIEF DESCRIPTION OF THE DRAWINGS

The features of the present invention that are believed to be novel are set forth with particularity in the appended claims. However, the invention together with further advantages thereof, may best be understood by reference to the accompanying drawings where in:

DETAILED DESCRIPTION OF A PREFERRED EMBODIMENT

Generally this disclosure concerns an adaptive Reed-Solomon decoder suitable as the basis of an adaptive soft decision receiver and methods therein. In overview the adaptive Reed-Solomon(RS) decoder is arranged and constructed to decode a RS(n,k) encoded symbol stream and includes a code register, coupled to the symbol stream, for storing a received code word including n code symbols and an index register for storing a location information corresponding to each of a portion of the code symbols. Further included is a processor, coupled to the code register and the index register, for performing soft decision, preferably, Reed-Solomon decoding, preferably, using euclid's algorithm, utilizing an error parameter and an erasure parameter to provide corrected data when the soft decision decoding is successful and to provide a failure indication when the soft decision decoding is unsuccessful. Also included is a controller; coupled to the processor, for providing the error parameter and the erasure parameter and for adjusting the error parameter and the erasure parameter when the processor provides said failure indication.

An analogous method of adaptively decoding an encoded symbol stream with a Reed-Solomon decoder arranged and constructed to decode a RS(n,k) encoded symbol stream includes the steps of; storing a received code word including n code symbols, storing a location information for each of a portion of the code symbols, performing soft decision decoding using an error parameter and an erasure parameter to provide corrected data when the soft decision decoding is successful and to provide a failure indication when the soft decision decoding is unsuccessful, and then adjusting, responsive to the failure indication, the error parameter and the erasure parameter, preferably for another attempt at decoding.

Figure 1:
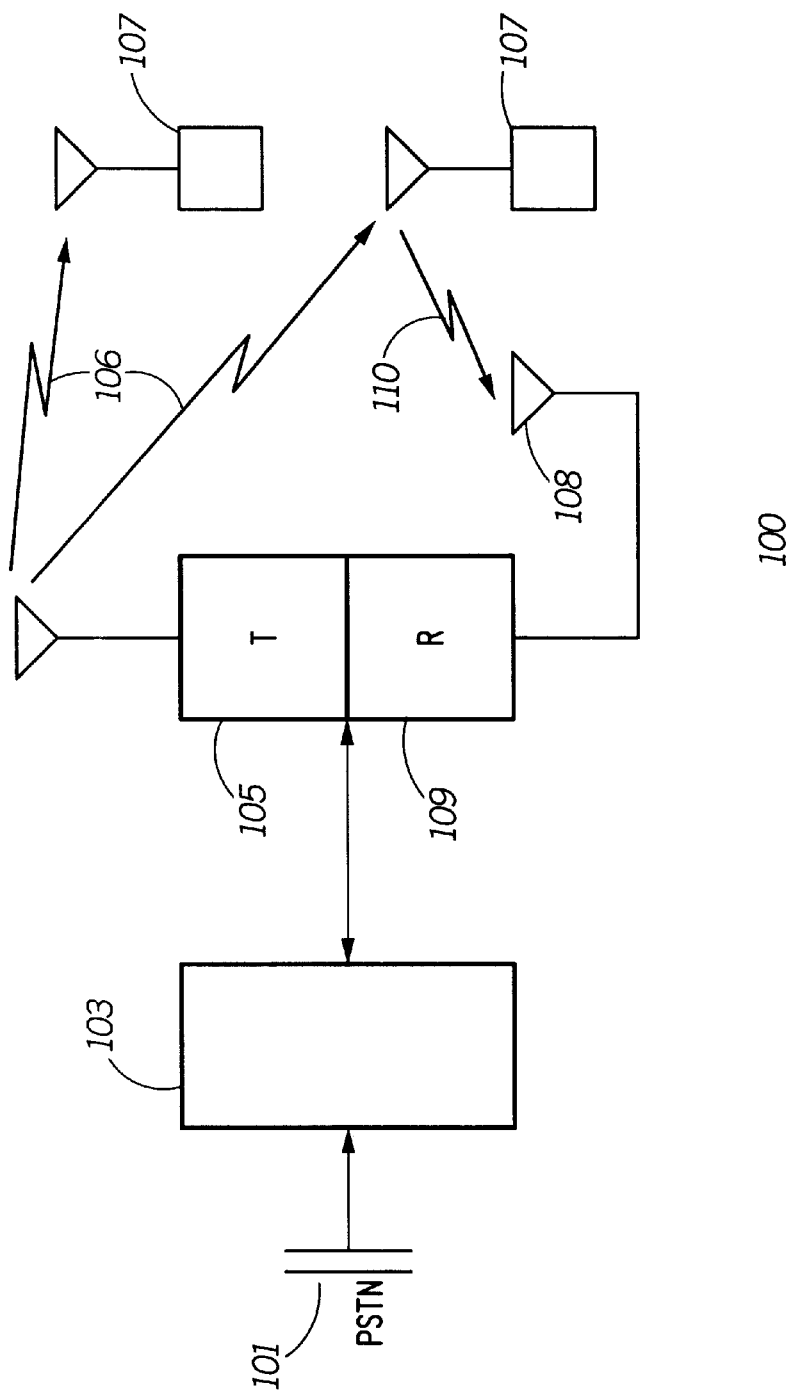
FIG. 1 is a block diagram of a selective messaging system suitable for employing an embodiment of the instant invention.

Referring to the figures for a better understanding of the inventive principles within the preferred embodiment of the instant invention, FIG. 1 depicts a selective messaging system (100) in overview block diagram format. The system includes a switch, terminal, or controller (103) coupled to a message source (101), such as the Public Switched Telephone Network. The controller (103) is coupled to a selective message transmitter system or base transmitter (105) and provides messages, such as paging messages, and control/scheduling information to this transmitter system.

Each base transmitter (one depicted) uses the control scheduling information together with the messages to modulate a radio frequency carrier in accordance with a chosen modulation technique, such as preferably frequency shift keyed (FSK) modulation but equally applicable phase shift keyed (PSK) modulation or quadrature amplitude modulation (QAM), and transmits the messages from an antenna, as a modulated radio frequency carrier, over a, preferably, wireless channel (106) to the selective messaging units (107), such as paging message units (PMU) via their respective antennas. While the two PMUs are shown it is understood that a plurality of such units may exist in actual systems and that each base transmitter will be capable of delivering messages to many such PMUs.

The above description applies to so called one way selective messaging systems where messages are delivered from the base transmitters to the PMUs. In two way systems where messages may originate at the PMUs, either volitional or responsive to a message from the base transmitter, the messaging system will additionally have one or more base receivers (109). In such systems the PMUs (107) transmit a message, such as an acknowledgment (ACK) or status message from their respective antennas over their respective uplink wireless channels (110) to one or more of these base receivers (109) via their antenna (108). The receivers are coupled to the controller (103) as depicted and allow the controller (103) to provide the appropriate base transmitter with a non-acknowledgment (NACK) signal or the like under suitable circumstances.

It is noted that the selective messaging system (100) as depicted is merely an exemplary setting for the instant disclosure and serves to facilitate disclosure and in no way is intended to limit the true spirit and scope of the present invention. Actual systems may include significant additional base transmitters, PMUs, base receivers and may include an overlaying, perhaps satellite based system for maintaining a common time reference at each base transmitter for facilitating such functions as simulcasting a message from multiple base transmitters. The wireless channels (106) or uplink wireless channels (110) may be the same or different radio frequencies depending on the system design, or immediate objective. In any event the instant disclosure deals predominantly with inventive principles applicable, for example, to receivers such as found in the PMUs and preferably the base receiver (109) although these principles may find application in many fields including nearly all communications systems.

Figure 2:
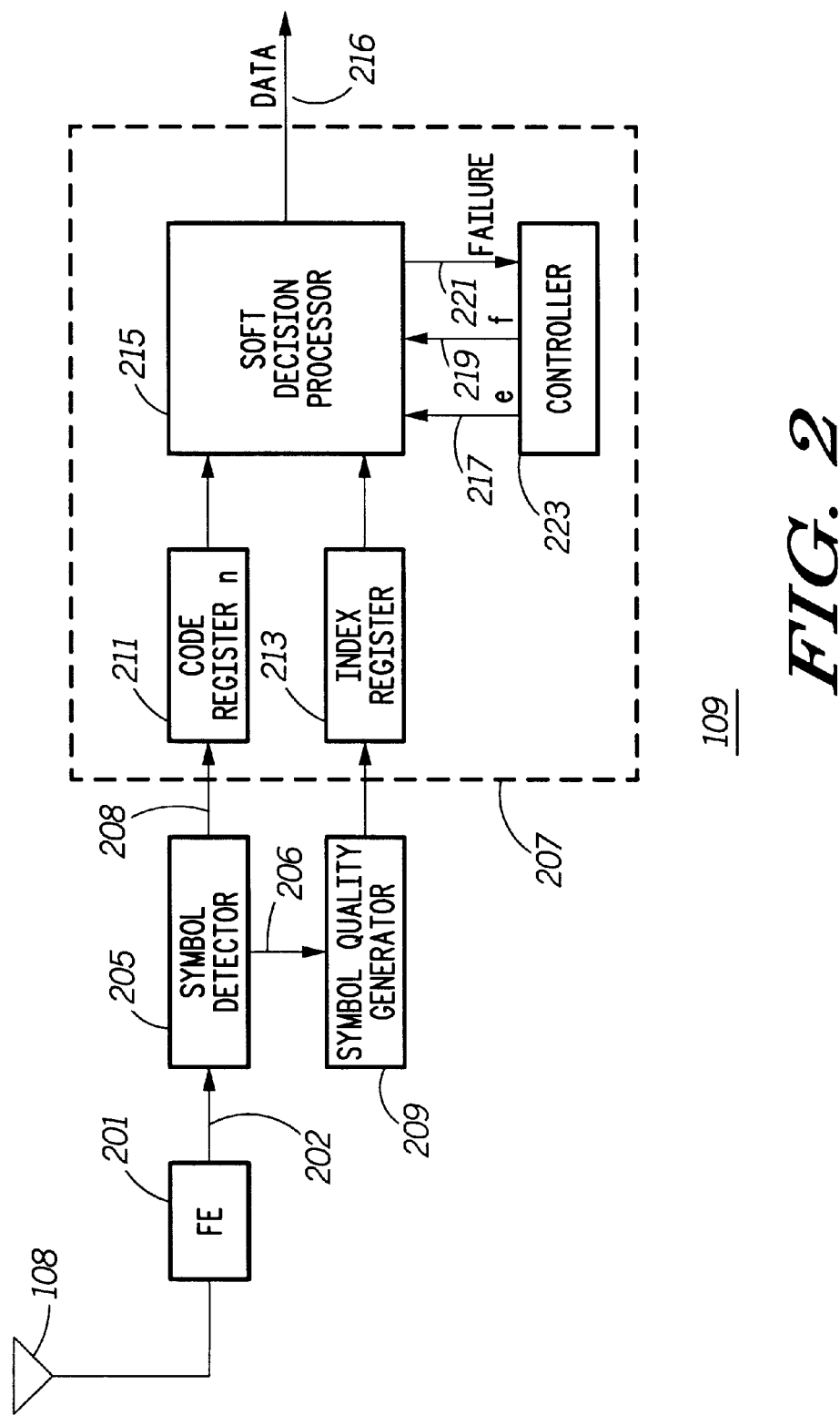
FIG. 2 is a more detailed block diagram of an adaptive soft decision receiver including a preferred embodiment of an adaptive Reed-Solomon decoder suitable for use in the FIG. 1 messaging system.

Thus we focus on the more detailed FIG. 2 block diagram of the receiver (109), preferably a soft decision receiver, wherein like reference numerals refer to like entities. FIG. 2 depicts the antenna (108) coupled to a radio frequency front end (201) where messages from the uplink wireless channel (110) are amplified, filtered, mixed to a low frequency baseband signal, and then demodulated to form a baseband signal, more specifically and preferably a sampled or discrete time signal, at output (202), all in accordance with approaches readily evident to one of ordinary skill in the art.

The receiver (109) is, preferably, an adaptive soft decision receiver employing an adaptive Reed-Solomon decoder (207), for a Reed-Solomon(RS) encoded channel that is arranged and constructed to demodulate and decode a RS(n, k) encoded symbol stream. This receiver includes a symbol detector (205) coupled to the channel, specifically the baseband signal at output (202), that operates to detect channel symbols, such as preferably FSK encoded or modulated symbols and decode these channel symbols to provide a corresponding code symbol or RS encoded code symbol stream at output (208). In addition the preferred symbol detector provides a channel quality measurement at output (206), preferably an estimated signal to noise ratio (SNR) corresponding to each channel symbol.

The unique elements of a preferred form of the symbol detector (205) are described in co-pending applications, assigned to the same assignee, as here having like filing dates both invented by Chen and designated, respectively, PF01181NA, titled "A Signal Processor With Improved Efficiency" and PT02131U, titled "A Signal Quality Detector". Both applications are hereby incorporated herein in full by reference. The symbol detector (205) is coupled to the adaptive Reed-Solomon decoder (207), specifically to a code register (211) that is arranged for storing a received code word including n code symbols, preferably 32 such symbols. Additionally the symbol detector (205) is coupled, by a symbol quality generator (209), to an index register (213) that operates to store location information corresponding to a portion of the code symbols, preferably up to n−k, in the code register.

Further included in the adaptable Reed-Solomon decoder (207) is a processor (215), coupled to the code register and the index register, for performing soft decision decoding using an error parameter at input (217) and an erasure parameter at input (219) and, preferably, in accordance with Euclid's algorithm to provide corrected data at (216) when the soft decision decoding is successful and to provide a failure indication at output (221) when said soft decision decoding is unsuccessful. Also included is a controller, coupled to the processor, for providing the error parameter at input (217) and the erasure parameter at input (219).

Additionally the controller is charged with adjusting the error parameter and the erasure parameter when the processor provides a failure indication at output (221). The controller initially sets the erasure parameter, f, and error parameter, e, to some predetermined values. In the preferred embodiment these values have been selected to correspond to a fading environment with burst errors and to adjust the decoder toward a AWGN situation when that is not successful. As an alternative these values could be initially set to correspond to an AWGN environment and subsequently adjusted toward a fading environment. For the fading environment e is set to zero and f is set n−k, preferably 8. From the initial settings the controller will increase the error parameter, preferably, one step at a time and decrease the erasure parameter, preferably, 2 steps at a time until e =(n−k)/2 and f=0. After an adjustment to the parameters the processor will re-attempt to perform soft decision decoding.

The symbol quality generator (209) as noted above is coupled between the symbol detector (205) and the index register (213). This symbol quality generator provides the location information that is stored in the index register. This location information corresponds to a list of code symbol locations, where the list is ordered in accordance with a code symbol quality for each code symbol. The symbol quality generator orders the list from a worst to a best code symbol quality and the list may includes up to n−k code symbol locations. The symbol quality generator uses the channel quality measurements from the symbol detector to provide the code symbol quality for each code symbol. In particular the code symbol quality corresponds to a weighted average of the channel quality measurements during a code symbol duration. This accounts for a code symbol possibly occupying more than one channel symbol.

To further explain the ordering and weighting operations an example set in the preferred embodiment will be explained. Let q be the number of bits per code symbol and r the number of bits per modulation symbol, and assume q is greater than r. For the preferred embodiment, q is equal to 5 and r is equal to 2, so there are 2.5 modulation symbols per received code symbol. Let the channel quality measurements, designated {snr1, snr2, snr3}, be the ones corresponding to channel symbols indexed or located in symbol time slots {1, 2, 3}, respectively. Then a particular code symbol, specifically the code symbol in the first location is formed by modulation symbol index 1, modulation symbol index 2, and the first half of modulation symbol index 3. Then, the preferred way of defining or providing the code symbol quality (CSQ) for the this code symbol is $CSQ_1 = 0.4(snr1 + snr2) + 0.2\ snr3.$ The symbol quality generator(209) repeats the process described in above such that a stream of code symbol quality(CSQ) indicators is obtained, each of them linked to a particular code symbol on a one-to-one basis.

The symbol quality generator(209) orders the list of code symbol quality(CSQ) indicators in order to store the corresponding location information in the index register(213). In the preferred method of ordering the CSQ indicators, the symbol quality generator(209) partitions the stream of CSQ indicators on the code word boundaries, forming blocks of length n CSQ indicators for each codeword of length n. Next, the symbol quality generator(209) applies a selection-sort algorithm to each block of CSQ indicators. The selection-sort algorithm extracts the indexes of the n−k smallest CSQ indicators in the block and forms an index vector by storing the mentioned n−k indexes, starting with the index corresponding to the smallest CSQ in the block, continuing with the index corresponding to the second-to-smallest CSQ in the block, continuing in this fashion until the n−k indexes are stored a the location information or as the index vector.

The symbol quality generator(209) transfers the index vector into the index register at the same time as the symbol detector(205) stores the corresponding code word into the code register.

As earlier noted the soft decision decoding is preferably performed in accordance with Euclid's algorithm, in particular an extended version of Euclid's algorithm. While the literature, specifically pages 49–53, 203, 211, 224–226, and 230–231 in *Error Control Systems for Digital Communication and Storage*, by Stephen B. Wicker. Prentice Hall, 1995, has a detailed explanation of this algorithm that is hereby incorporated by reference, a brief overview will be provided here.

For RS erasure decoding, the pre-work before applying the extended version of Euclid's algorithm includes computing the modified erasure polynomial; this includes forming the erasure polynomial using the location information provided in the index register(213) and computing the syndrome polynomial using a modified version of the received code word, where the erased elements of the code register(211) are replaced with zeros.

Given B={a,b} is a subset of elements from an Euclidean domain D, the extended version of Euclid's algorithm is a very fast recursive method for finding s and t such that the greatest common divisor(GCD) of a and b is $GCD(a,b) = sa + tb.$ Initialization of the recursion includes setting the a to be the polynomial variable x raised to the (n−k+1) power and the b to be the modified erasure polynomial.

To apply or use the extended version of Euclid's algorithm next use or perform steps 1. through 4., page 53 of *Error Control Systems for Digital Communication and Storage*, by Stephen B. Wicker, Prentice Hall, 1995, until the stopping condition has been reached. For a given set of variables {ri, ti, si} and the polynomial variable x, the stopping condition follows as $deg[ri(x)] <= (n−k+f)/2$, for f even, or $deg[ri(x)] <= (n−k+f−1)/2$, for f odd.

Next, find the roots of the ti(x) to determine the error locations, and determine the magnitude of the errors and erasures by applying a modified version of the Forney algorithm, described on page 222 of *Error Control Systems for Digital Communication and Storage*, by Stephen B. Wicker, Prentice Hall, 1995 and incorporated herein by reference. Using these error and erasure values compute an error/erasure polynomial, and finally construct the decoded received word by subtracting the error/erasure polynomial from the received polynomial to obtain the desired code polynomial.

The instant invention is preferably embodied in a Digital Signal Processor (DSP), specifically a Motorola DSP56166, a 16 bit fixed point DSP, together with a Motorola MCM68302 or MCM68360 microprocessor both of which are cooperatively executing software readily developed or written by one of ordinary skill in the art. Operationally the preferred embodiment may be viewed as a method as depicted in FIG. 3.

Figure 3:
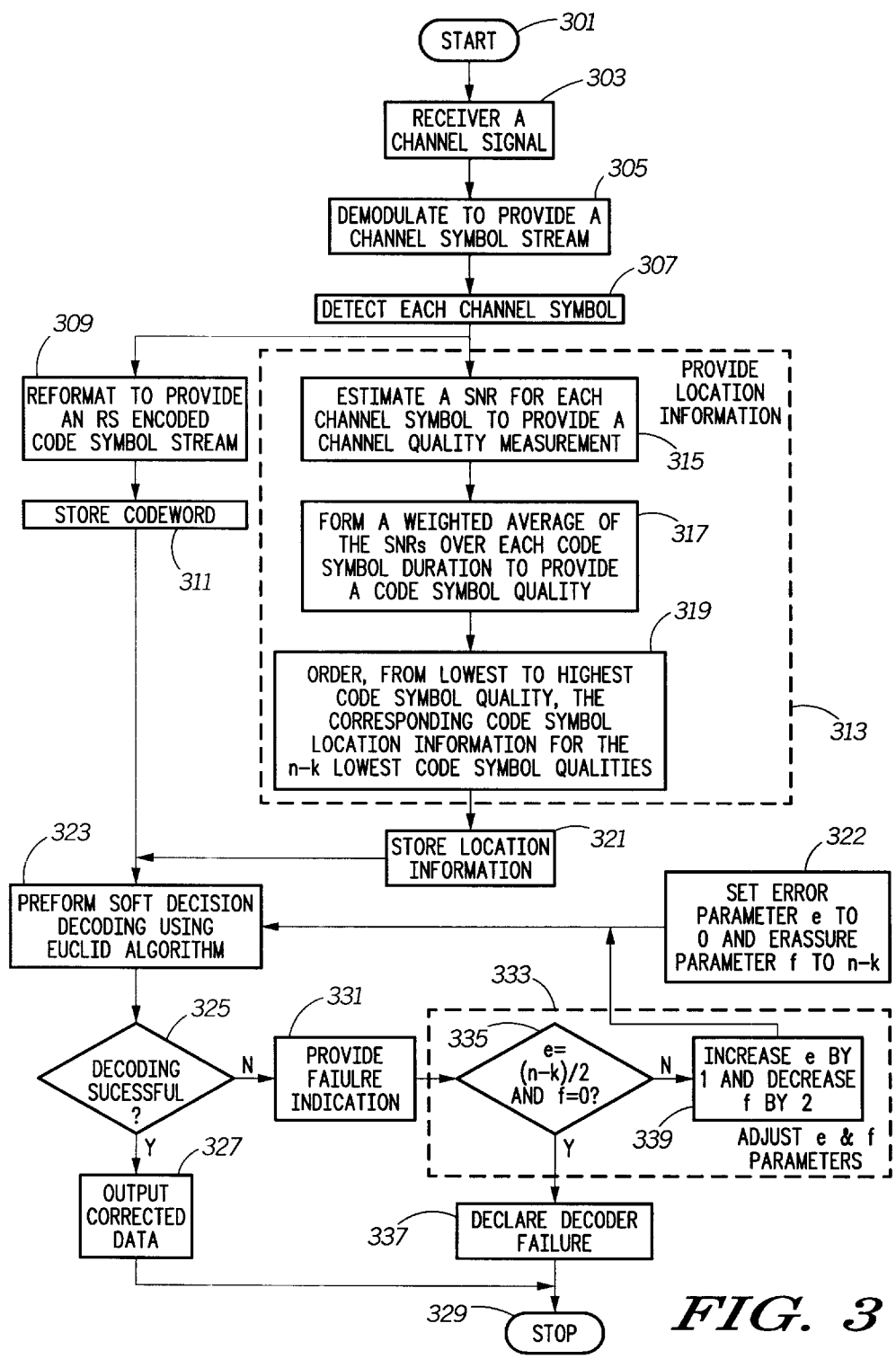
FIG. 3 is a flow chart of a preferred method of adaptive soft decision decoding as practiced by the FIG. 2 decoder and receiver.

FIG. 3 depicts a method of adaptively decoding a Reed-Solomon RS(n,k) encoded symbol stream. The method starts at step (301) by receiving a channel signal at step (303). Then at step (305) the channel signal is demodulated to provide a channel ymbol stream. At step (309) the channel symbols are reformatted to provide an RS encoded code symbol stream after which step (311) stores a received code word including n code symbols. In addition the channel symbol go to step (313) where location information for each of a portion, preferably up to n−k, of the code symbols is provided and then stored at step (321). Step (322) sets an error parameter, e, to 0 and an erasure parameter, f to n−k.

Using these parameters, the stored location information, and the stored code word step (323) performs soft decision decoding, preferably using Euclid's algorithm. Step (325) tests to see if the decoding was successful and if so step (327) outputs corrected data and the process ends at (329). If decoding was not successful at step (325) the "NO" path is followed to step (331) where a failure indication is provided. This failure indication initiates step (333) where the e and f parameters are adjusted. This step includes step (335) which tests to see if the parameters have already been adjusted to there respective limits of e (n–k)/2 and f =0. If so then step (337) declares a decoder failure and the process stops at (329). If not step (329) increases e by one and decreases f by two after which step (323) is repeated.

Step (313) includes step (315) where a channel quality measurement, preferably an estimate of SNR for each channel symbol, is provided to step (317) where a weighted average of these SNRs is formed over each code symbol duration to provide a code symbol quality. Then at step (319) the location information for the n–k lowest code symbol qualities are ordered from lowest to high est. code symbol quality yielding a list of code symbol locations or location information for storage at step (321).

In summary an inventive apparatus and method have been disclosed that allow soft decision receivers or erasure decoders to be used even under the extreme conditions of a wireless or other highly variable channel by in effect re-optimizing the settings, error and erasure parameters, for the decoder depending on the success or failure of a decoding operation. For highly corrupted FSK channels the settings of the erasure decoder vary, covering their whole possible range, including the hard-decision alternative where e is (n–k)/2 and f is 0. These principles may be used to advantage in receivers that have to decode a Reed-Solomon coded word transported over an M-ary channel with variable white noise and/or fading effects. Use of these approaches may yield as much as a 2× improvement in bit error rate under fast fading conditions. This results into a significant improvement in receiver sensitivity and thus in a lower word-rate for the system, given a fixed number of receivers in the system; or in less receivers for a certain area of coverage, given a certain maximum power for the mobile units (PMUs). In any case, the increase in sensitivity has a cost-reduction effect on the system.

It will be appreciated by those of ordinary skill in the art that the apparatus and methods disclosed provide various inventive techniques for adaptive soft decision receivers such as those employing an adaptable form of erasure Reed-Solomon decoders. The decoder structure and methods discussed have the potential to correct two times as many errors and still avoid the heretofore adverse consequences of a fixed coder setting under variable channel conditions. This has been done without compromising other relevant operational characteristics. These inventive structures and methods may be readily and advantageously employed in a messaging system, messaging receiver, or other communications devices or system so as to allow the use of fewer receivers for equivalent coverage of a fixed area. Hence, the present invention, in furtherance of satisfying a long-felt need of messaging systems readily facilitates soft decision decoding in for example, low power consumption portable receivers by providing methods and apparatus for signal decoding that are practical to implement from a physical, economic and power source perspective.

It will be apparent to those skilled in the art that the disclosed invention may be modified in numerous ways and may assume many embodiments other than the preferred forms specifically set out and described above. For example, the decoder parameters while, preferably set for fading conditions, may be set for any typical channel condition and adjusted from there. These parameters may.be initialized in accordance with present conditions such as average channel signal strength rather than a fixed initialization point. Accordingly, it is intended by the appended claims to cover all modifications of the invention which fall within the true spirit and scope of the invention.

What is claimed is:

1. An adaptive Reed-Solomon(RS) decoder arranged and constructed to decode a RS(n,k) encoded symbol stream, the decoder comprising in combination;

a code register, coupled to the symbol stream, for storing a received code word including n code symbols, an index register for storing a location information corresponding to each of a portion of said code symbols, a processor, coupled to said code register and said index register, for performing soft decision decoding using an error parameter and an erasure parameter to provide corrected data when said soft decision decoding is successful and to provide a failure indication when said soft decision decoding is unsuccessful, and a controller, coupled to said processor, for providing said error parameter and said erasure parameter and for adjusting said error parameter and said erasure parameter when said processor provides said failure indication.

2. The adaptive Reed-Solomon(RS) decoder of claim 1 wherein said controller further increases said error parameter and decreases said era'sure parameter.

3. The adaptive Reed-Solomon(RS) decoder of claim 2 wherein said error parameter is increased by one and said erasure parameter is decreased by two.

4. The adaptive Reed-Solomon(RS) decoder of claim 3 wherein said error parameter is initially set to zero and eventually increased to (n–k)/2, the erasure parameter is initially set to n–k and decreased to zero, and said portion of said code symbols is up to n–k.

5. The adaptive Reed-Solomon(RS) decoder of claim 1 further including a symbol quality generator, coupled to said index register, for providing said location information.

6. The adaptive Reed-Solomon(RS) decoder of claim 5 wherein said symbol quality generator provides said location information to correspond to a list of code symbol locations, said list ordered in accordance with a code symbol quality for each code symbol.

7. The adaptive Reed-Solomon(RS) decoder of claim 6 wherein said symbol quality generator orders said list from a worst to a best code symbol quality and said list includes up to n–k code symbol locations.

8. The adaptive Reed-Solomon(RS) decoder of claim 7 further including a symbol detector, coupled to said symbol quality generator, for providing a channel quality measurement corresponding to each channel symbol.

9. The adaptive Reed-Solomon(RS) decoder of claim 8 wherein said channel quality measurement is used by said symbol quality generator to provide said code symbol quality.

10. The adaptive -Reed-Solomon(RS) decoder of claim 9 wherein said channel quality measurement is an estimated signal-to-noise ratio (SNR) over said each channel symbol.

11. The adaptive Reed-Solomon(RS) decoder of claim 10 wherein said code symbol quality corresponds to a weighted average of said channel quality measurements during a code symbol duration.

12. The adaptive Reed-Solomon(RS) decoder of claim 1 wherein said processor performs said soft decision decoding in accordance with a Euclid's algorithm.

13. An adaptive soft decision receiver for a Reed-Solomon(RS) encoded channel arranged and constructed to demodulate and decode a RS(n,k) encoded symbol stream, the receiver comprising in combination;
- a symbol detector coupled to the channel for detecting channel symbols and providing a corresponding code symbol stream,
- a code register, coupled to said symbol detector, for storing a received code word including n code symbols,
- an index register, coupled to said symbol detector for storing a location information corresponding to a portion of said code symbols,
- a processor, coupled to said code register and said index register, for performing soft decision decoding using an error parameter and an erasure parameter to provide corrected data when said soft decision decoding is successful and to provide a failure indication when said soft decision decoding is unsuccessful, and
- a controller, coupled to said processor, for providing said error parameter and said erasure parameter and for adjusting said error parameter and said erasure parameter when said processor provides said failure indication.

14. The adaptive soft decision receiver of claim 13 wherein said controller further increases said error parameter and decrease said erasure parameter.

15. The adaptive soft decision receiver of claim 14 wherein said adjusting includes said error parameter being increased by one and said erasure parameter being decreased by two.

16. The adaptive soft decision receiver of claim 15 wherein said error parameter is initially set to zero and eventually increased to (n−k)/2, the erasure parameter is initially set to n−k and decreased to zero, and said portion of said code symbols is up to n−k.

17. The adaptive soft decision receiver of claim 13 further including a symbol quality generator, coupled to said index register and said symbol detector, for providing said location information.

18. The adaptive soft decision receiver of claim 17 wherein said symbol quality generator provides said location information to correspond to a list of code symbol locations, said list ordered in accordance with a code symbol quality for each code symbol.

19. The adaptive soft decision receiver of claim 18 wherein said symbol quality generator orders said list from a worst to a best code symbol quality and said list includes up to n−k code symbol locations.

20. The adaptive soft decision receiver of claim 19 wherein said symbol detector further provides a channel quality measurement corresponding to each channel symbol.

21. The adaptive soft decision receiver of claim 20 wherein said channel quality measurement is used by said symbol quality generator to provide said code symbol quality.

22. The adaptive soft decision receiver of claim 21 wherein said channel quality measurement is an estimated signal-to-noise ratio (SNR) over said each channel symbol.

23. The adaptive soft decision receiver of claim 22 wherein said code symbol quality corresponds to a weighted average of said channel quality measurements during a code symbol duration.

24. The adaptive soft decision receiver of claim 13 wherein said processor performs said soft decision decoding in accordance with a Euclid's algorithm.

25. In a Reed-Solomon decoder arranged and constructed to decode a RS(n,k) encoded symbol stream a method of adaptively decoding the encoded symbol stream including the steps of;
- storing a received code word including n code symbols,
- storing a location information for each of a portion of said code symbols,
- performing soft decision decoding using an error parameter and an erasure parameter to provide corrected data when said soft decision decoding is successful and to provide a failure indication when said soft decision decoding is unsuccessful, and
- adjusting, responsive to said failure indication, said error parameter and said erasure parameter.

26. The method of adaptively decoding of claim 25 wherein said step of adjusting further includes increasing said error parameter and decreasing said erasure parameter.

27. The method of adaptively decoding of claim 26 wherein said step of adjusting results in said error parameter being increased by one and said erasure parameter being decreased by two.

28. The method of adaptively decoding of claim wherein said step of performing said soft decision decoding is repeated responsive to said step of adjusting.

29. The method of adaptively decoding of claim 28 wherein said error parameter is initially set to zero and eventually increased to (n−k)/2, the erasure parameter is initially set to n−k and decreased to zero, and said portion of said code symbols is up to n−k.

30. The method of adaptively decoding of claim 25 further including a step of providing said location information.

31. The method of adaptively decoding of claim 30 wherein said step of providing said location information further includes a step of providing a code symbol quality for each code symbol and a step of ordering a list of code symbol locations in accordance with said code symbol quality.

32. The method of adaptively decoding of claim 31 wherein said step of ordering said list further includes ordering a list of up to n−k code symbol locations from a worst to a best code symbol quality.

33. The method of adaptively decoding of claim 31 further including a step of providing a channel quality measurement corresponding to each channel symbol and wherein said step of providing said code symbol quality includes a step of using said channel quality measurement to provide said code symbol quality.

34. The method of adaptively decoding of claim 33 wherein said channel quality measurement is a estimated signal-to-noise ratio (SNR) over said each channel symbol.

35. The method of adaptively decoding of claim 34 wherein said step of providing said code symbol quality includes a step of forming a weighted average of said channel quality measurements during a code symbol duration.

36. The method of adaptively decoding of claim 25 wherein said step of performing said soft decision decoding includes using a Euclid's algorithm.

* * * * *

UNITED STATES PATENT AND TRADEMARK OFFICE
CERTIFICATE OF CORRECTION

PATENT NO.    : 6,511,280 B1                                    Page 1 of 1
DATED         : January 28, 2003
INVENTOR(S)   : Sammartino, Pablo Eduardo et al.

It is certified that error appears in the above-identified patent and that said Letters Patent is hereby corrected as shown below:

Column 8,
Line 30, change "era'sure" to -- erasure --

Column 10,
Line 24, add -- 27 -- after "decoding of claim"

Signed and Sealed this

Twelfth Day of August, 2003

JAMES E. ROGAN
*Director of the United States Patent and Trademark Office*